United States Patent [19]
Stokes et al.

[11] Patent Number: 5,382,930
[45] Date of Patent: Jan. 17, 1995

[54] MONOLITHIC MULTIPOLE FILTERS MADE OF THIN FILM STACKED CRYSTAL FILTERS

[75] Inventors: Robert B. Stokes, Torrance; Edward M. Garber, Los Angeles; Jay D. Crawford, Long Beach; Drew Cushman, Lomita, all of Calif.

[73] Assignee: TRW Inc., Redondo Beach, Calif.

[21] Appl. No.: 993,575

[22] Filed: Dec. 21, 1992

[51] Int. Cl.⁶ .................. H03H 9/56; H03H 9/58
[52] U.S. Cl. ....................... 333/191; 333/192; 310/321
[58] Field of Search ............... 333/187–192; 310/321, 324, 311

[56] References Cited
U.S. PATENT DOCUMENTS

| | | | |
|---|---|---|---|
| 3,344,369 | 9/1967 | Bies et al. | 333/189 |
| 3,624,564 | 11/1971 | Ise et al. | 333/192 X |
| 3,983,518 | 9/1976 | Bezemer | 333/191 |
| 5,185,589 | 2/1993 | Krishnaswamy et al. | 333/191 X |
| 5,194,836 | 3/1993 | Vale et al. | 333/191 X |

FOREIGN PATENT DOCUMENTS 156220  9/1983  Japan ........................... 333/191

Primary Examiner—Benny Lee

[57] ABSTRACT

This invention discloses a monolithic multipole stacked crystal filter comprised of a series of cascaded 2-port semiconductor bulk acoustic resonator stacked crystal filters electrically cascaded and a shunt inductor connected between each of the 2-port filters. Each of the 2-port filters including a first and second piezoelectric layer, typically aluminum nitride. A first input electrode is positioned on a top surface of one of the piezoelectric layers and a second output electrode is positioned on a bottom surface of the other of the piezoelectric layers. A ground electrode is positioned between the piezoelectric layers. In this regard, the piezoelectric layers will resonate at a resonant frequency and provide bandpass filter characteristics. The complete monolithic multipole filter provides control of the passband shape which yields highly desirable filter characteristics.

18 Claims, 3 Drawing Sheets

MONOLITHIC MULTIPOLE FILTERS MADE OF THIN FILM STACKED CRYSTAL FILTERS

The U.S. government has a paid-up license in this invention and the right in limited circumstances to require the patent owner to license others on reasonable terms as provided for by the terms of Contract No. N62269-89-C-0026 awarded by Naval Command Control and Ocean Surveillance Center.

BACKGROUND OF THE INVENTION

1. Field of the Invention

The present invention relates generally to a thin film stacked crystal filter and, more particularly, to a 2-port multipole filter comprised of a series of cascaded thin film stacked crystal filters.

2. Discussion of the Related Art

Semiconductor bulk acoustic resonators (SBARs), well known to those skilled in the art, are thin film acoustic resonators fabricated on a semiconductor substrate. SBARs typically operate similar to a conventional bulk crystal resonator, but are much thinner and resonate at a much higher frequency. An SBAR will generally include a thin layer, or film, of a piezoelectric material, such as zinc oxide or aluminum nitride, with conducting thin film electrode layers fabricated on opposite surfaces of the piezoelectric layer. The thin film piezoelectric layer is generally formed by a sputtering process on a suitable semiconductor substrate. Such a fabrication technique enables an SBAR to be integrated into semiconductor circuits including oscillators, filter-amplifiers, receivers, etc.

It is known to provide stacked SBARs where electrodes are positioned above, between and below multiple piezoelectric layers to form a 2-port stacked crystal filter (SCF). A SCF incorporating multiple SBARs of this type operates as a complete filter for producing a narrow band frequency output. These types of filters, however, do not have output passband shapes controllable by design and therefore are limited in their application. For a review of devices incorporating SBARs, see Cushman, D., et al., "SBAR Filter Monolithically Integrated with HBT Amplifier," Proceedings 1990, IEEE Ultrasonic Symposium and Kline, G. R. et al., "Thin Film Microwave Acoustic Filters on GaAs," IEEE GaAs IC Symposium, 1988.

Multipole filters incorporating 1-port SBARs are also known in the art. One example is disclosed in Driscoll, M. M., et al., "Recent Advances in Monolithic Film Resonator Technology," Ultrasonic Symposium, 1986, pp 365–369. Driscoll discloses a multipole filter comprised of a series configuration of 1-port SBARs including inductors electrically connected to ground between the SBARs. The Driscoll approach, however, suffers from direct feedthrough through the capacitance of the individual 1-port SBARs. This feedthrough is cancelled at the center frequency by adding a shunt inductor $L_o$ in parallel with each SBAR. However, this inductor doubles the number of tuning components of the system and is not effective at out-of-band frequencies as can be seen by FIG. 5 in that document.

Also known in the art are 2-port multipole filters incorporating surface acoustic wave (SAW) resonators as disclosed in Schreve, W. R., "Surface-Wave-to-Port Resonator Equivalent Circuit." Because this approach uses the surface acoustic wave technique, and not the SBAR technique, it cannot realize the advantages associated with SBARs. The advantages of the SBAR which are not achieved with the SAW approach include: (1) integration with active circuits on semiconductor substrates; (2) small size; and (3) frequencies greater than 2 GHz.

What is needed then is an effective SBAR multipole filter which provides narrow band filtering and which has passband shape and rejection characteristics controlled by design. It is therefore an object of the present invention to provide such a filter.

SUMMARY OF THE INVENTION

This invention discloses a monolithic multipole filter formed of a series of cascaded 2-port SBAR stacked crystal filters (SCF). In one preferred embodiment, a plurality of cascaded 2-port SBAR SCFs are fabricated in series on a common semiconductor substrate in which each SBAR SCF includes two thin film piezoelectric layers having a ground electrode between them and input and output electrodes fabricated on opposite faces. An inductor is electrically connected in shunt to ground between each of the SBAR SCFs. The multipole stacked crystal filter will accept a broadband input spectrum and provide a narrow output spectrum with good rejection and good natural electromagnetic feedthrough suppression.

Additional objectives, advantages, and features of the present invention will become apparent from the following description and appended claims, taken in conjunction with the accompanying drawings.

DETAILED DESCRIPTION OF THE PREFERRED EMBODIMENT

The following discussion of the preferred embodiments concerning a multipole SBAR stacked crystal filter is merely exemplary in nature and is in no way intended to limit the invention or its application or uses.

Figure 1A:
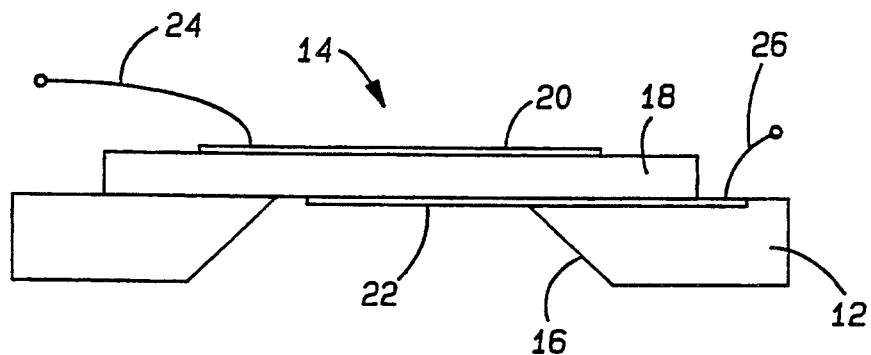
FIGS. 1(a) and 1(b) show a side view and a top view of a semiconductor bulk acoustic resonator fabricated on a semiconductor substrate.
Figure 1B:
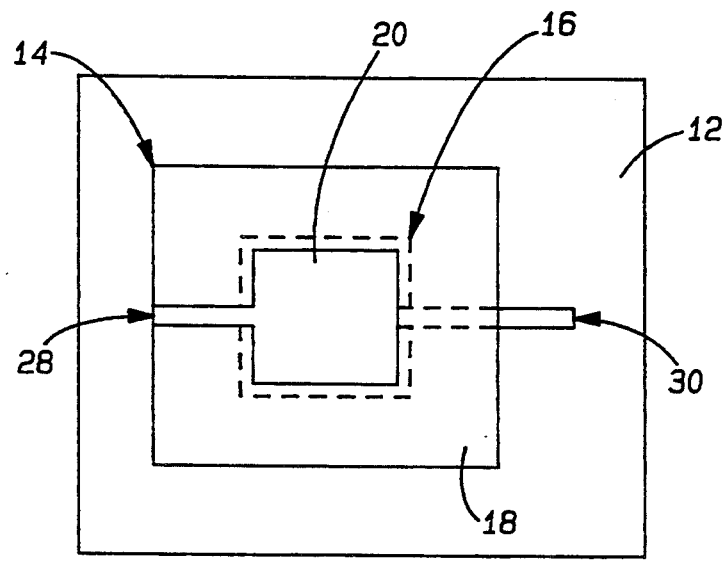

In order to understand the concept of the present invention, it is first necessary to understand the fundamentals of an SBAR. First turning to FIGS. 1(a) and 1(b), a semiconductor substrate 12 is shown on which is positioned a semiconductor bulk acoustic resonator (SBAR) 14. The SBAR 14 is comprised of a monolithic piezoelectric layer 18 sandwiched between a top electrode 20 and a bottom electrode 22, see FIG. 1(a). A backside via recess 16, as shown in FIG. 1(a) is etched in the substrate 12 following fabrication of the SBAR 14 such that a central, resonating area of the SBAR 14 is defined by the recess 16. As is apparent, the piezoelectric layer 18 and the recess 16 are substantially square, wherein the piezoelectric layer 18 is considerably larger to provide the necessary support to the SBAR 14. It should be noted, however, that the piezoelectric layer 18 and the recess 16 do not have to be square. In practice, the piezoelectric layer 18 will cover the whole of the substrate 12 for convenience. The vertical alignment of the electrodes 20 and 22 establishes the resonating area in alignment with the recess 16. As seen in FIG. 1(a), an input lead 24 is electrically connected to the electrode 20 and a ground lead 26 is electrically connected to the electrode 22 for providing a resonating signal to the piezoelectric layer 18. In FIG. 1(b), the electrode 20 and the lead 24 are shown as an input trace 28, and the electrode 22 and the lead 26 are shown as a ground trace 30. An alternating electrical signal applied to the electrodes 20 and 22, and thus across the piezoelectric layer 18, will cause the piezoelectric layer 18 to resonate at its resonant frequency as is well understood in the art.

The semiconductor substrate 12 is typically gallium arsenide (GaAs) having a thickness of about 4 mils. The piezoelectric layer 18 will be, in a preferred embodiment, sputtered on the substrate 12 by a method well understood in the art. For a 1 GHz resonator, the piezoelectric layer 18 will be approximately 3.5 microns thick and be approximately 800 microns along each side. The electrodes 20 and 22 will be formed by an evaporated metal to a thickness of about 1000 angstroms. The area of the electrodes 20 and 22 determines the impedance of the resonator 14. Because the SBAR 14 is fabricated on a semiconductor substrate, it can be effectively incorporated with other solid state elements, such as heterojunction bipolar transistors (HBTs) and high electron mobility transistors (HEMTs) to form desirable circuits.

Figure 2A:
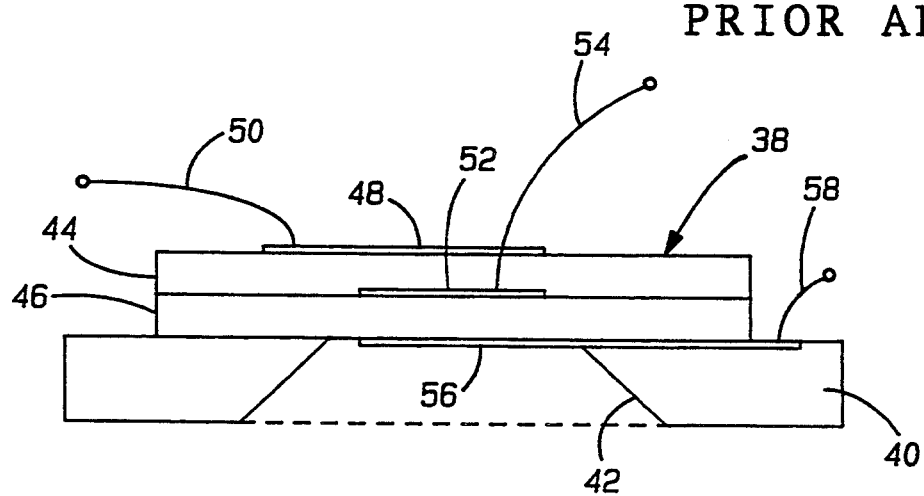
FIGS. 2(a) and 2(b) show a side view and a top view of a semiconductor bulk acoustic resonator stacked crystal filter on a semiconductor substrate.
Figure 2B:
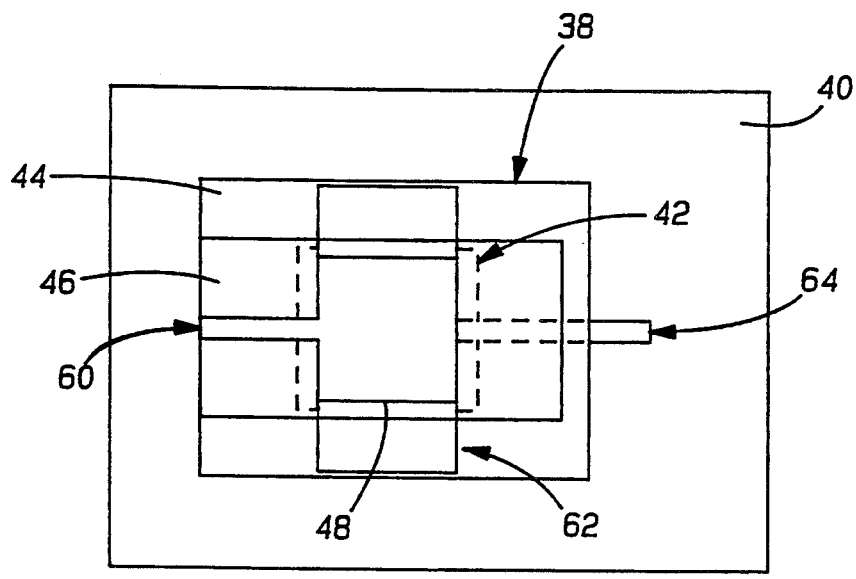

FIGS. 2(a) and 2(b) show a side view and top view of a 2-port SBAR stacked crystal filter (SCF) 38 positioned across a backside via recess 42 etched in a semiconductor substrate 40 as shown. The SCF 38 is comprised of two monolithic piezoelectric layers 44 and 46 of dimensions similar to the piezoelectric layer 18 above. The SCF 38 further includes a top input electrode 48 having a lead 50, a ground electrode 52 having a lead 54 positioned between and in contact with the piezoelectric layers 44 and 46, and a bottom output electrode 56 having a lead 58, as shown in FIG. 2(a). As above, the electrodes 48, 52 and 56 are formed of evaporated metal during the fabrication process of the SCF 38. In this regard, the SCF 38 is basically two SBARs, one on top of the other. In FIG. 2(b), the lead 50 is shown as an electrical trace 60, the ground electrode lead 54 is shown as an electrical trace 62, and the bottom lead 58 is shown as an electrical trace 64.

When a broadband signal is applied to the lead 50, the piezoelectric layers 44 and 46 will resonate, and produce a narrow band output on the lead 58. The SBARSCF 38 will thus reject frequencies within the broadband signal which are not close to the resonant frequency. The 2-port crystal filter 38 therefore functions as a complete filter without external components, and has good isolation between input and output because the electrode 52 is grounded and thus acts as an electrical shield. Consequently, the SCF 38 can be incorporated in a solid state circuit on a common substrate with other circuit elements.

Figure 2C:
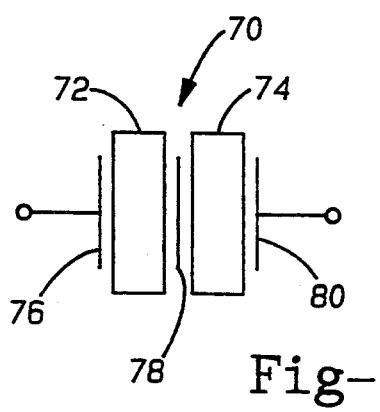
FIG. 2(c) shows a schematic representation of the stacked crystal filter of FIGS. 2(a) and (b)

In FIG. 2(c), a schematic representation of an SBAR stacked crystal filter 70 is shown. As above, the stacked crystal filter 70 includes two piezoelectric layers 72 and 74, an input port 76 comprised of an electrode and a lead line, a ground electrode 78 and an output port 80 also comprised of an electrode and lead line.

Figure 2D:
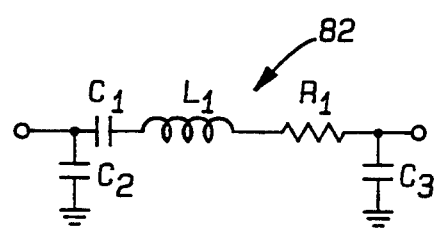
FIG. 2(d) shows an equivalent circuit of the stacked crystal filter of FIG. 2(c)

An equivalent circuit representation 82 of the stacked crystal filter 70 is shown in FIG. 2(d). The equivalent circuit 82 is known in the art as static capacitance C2 and C3 in parallel with a series combination of a motional inductance L1, a capacitance C1 and a resistance R1. It is the combination of these elements in this configuration that provides a resonating device.

Figure 3:
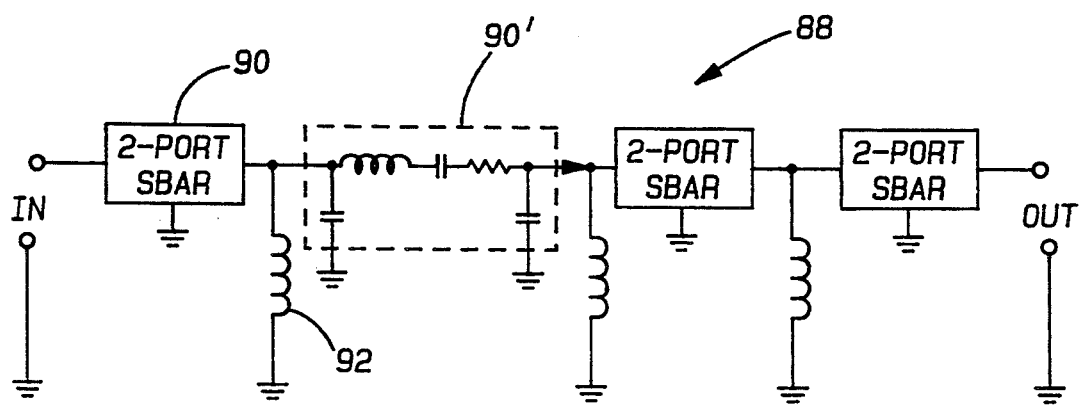
FIG. 3 shows a multipole filter comprised of a series of cascaded stacked crystal filters according to one preferred embodiment of the present invention.

FIG. 3 shows a 2-port multipole SBAR SCF 88 according to one preferred embodiment of the present invention. In this embodiment, the multipole SCF 88 includes four 2-port SBAR SCFs 90 electrically cascaded in series as shown. Each SBAR SCF 90 is a 2-port SBAR stacked crystal filter similar to the 2-port SBAR SCF 38 discussed above with reference to FIG. 2. Consequently, the equivalent circuit, as shown by 90', includes the same components as that of FIG. 2(d). The bottom output electrode of one SCF 90 is electrically connected to the top input electrode of the next SCF 90. Additionally, an inductor 92 is electrically connected in shunt to ground between each separate SBAR SCF 90 in a Chebyshev type design.

In operation, a broad spectrum input is applied to the input, labeled IN, terminals of the multipole filter 88. The first 2-port SBAR SCF 90 resonates at a particular resonant frequency, as discussed above for FIG. 2, which thereby rejects most of the frequencies outside of the resonant frequency, and thus applies a narrow band frequency signal at the input to the second 2-port SBARSCF 90. The second SBAR SCF 90 resonates at a similar frequency as the first SBAR SCF 90, and thus, provides additional rejection of the outside frequencies. Likewise, the third and fourth SBAR SCFs 90 also provide additional outside frequency rejection in a fine tuning capacity. This outside frequency rejection is provided by each of the 2-port SBAR SCFs 90 until a clean signal at a particular frequency is achieved at the output, labeled OUT, terminals of the multipole filter 88. Therefore, by providing multiple SCFs cascaded in series, the narrow band output signal will become more defined. The shunt inductors 92, and the exact resonant frequencies of the individual SBARS, are selected and tailored to provide the desired filter shape according to conventional filter design methods, such as in conventional Chebyshev filters. With each additional SCF added, however, the loss of the system increases. Therefore, there is a trade-off between system losses on the one hand and filter shape out-of-band rejection on the other.

Figure 4:
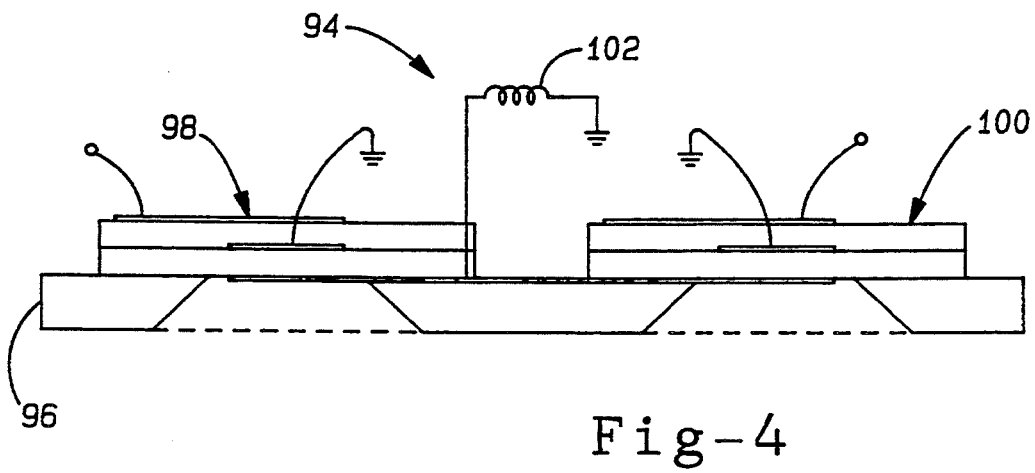
FIG. 4 shows a series of cascaded stacked crystal filters on a common substrate according to one preferred embodiment of the present invention.

FIG. 4 shows a plurality of cascaded 2-port SBAR SCFs 94 positioned on a common substrate 96. The plurality of SBAR SCFs 94 includes a first SBAR SCF 98 and a second SBAR SCF 100 each being similar to the SBAR SCF 38 shown in FIG. 2(a). Particularly, each SBAR SCF 98 and 100 includes a top electrode, a middle ground electrode, a bottom electrode, and two piezoelectric layers configured in the same manner as the SBAR SCF 38 of FIG. 2(a). Further, each of the SBAR SCFs 98 and 100 are positioned over a back side via recess in the substrate 96. An inductor 102 is connected in shunt to ground between the SBAR SCF 98 and the SBAR SCF 100.

In the configuration of FIG. 4, the SBAR SCF 98 is electrically connected to the SBAR SCF 100 by a common bottom electrode adjacent to the substrate 96. In such a configuration, the top electrode of the SBAR SCF 98 is an input electrode and the top electrode of the SBAR SCF 100 is an output electrode. A broad spectrum input signal is applied to the lead line connected to the top electrode of the SBAR SCF 98, and a narrow band output signal is taken from the lead line connected to the top electrode of the SBAR SCF 100. The lead lines connected to the middle electrodes of both the SBAR SCFs 98 and 100 are grounded.

Figure 5:
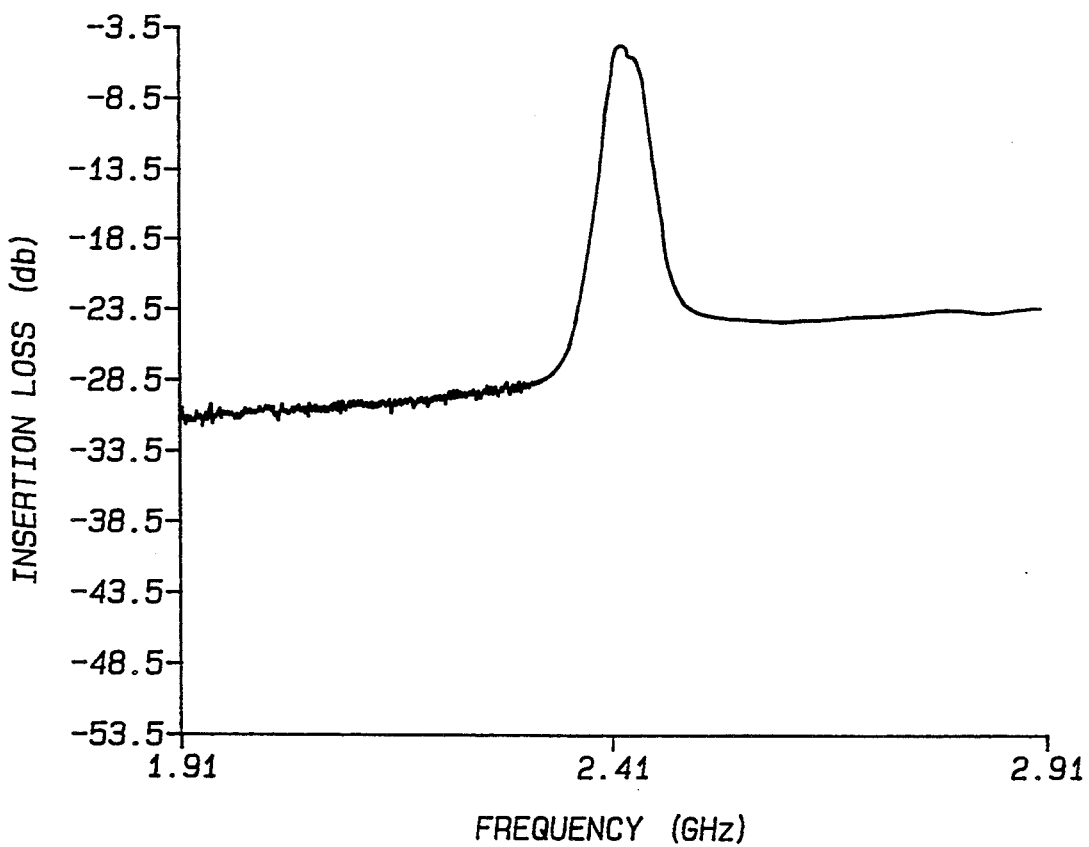
FIG. 5 shows a graphical representation of the output of the cascaded stacked crystal filters of FIG. 3.

FIG. 5 shows measured response characteristics (insertion loss) of a monolithic 4-pole SBAR SCF filter such as the multipole filter 88. This response has a center frequency at approximately 2.4 GHz and a bandwidth of approximately 33.8 MHz. By altering the shunt inductors 92 and the characteristics of the SCFs, different frequencies are achievable. The multipole filter 88 can be designed to use either the acoustic fundamental or harmonic resonances of an SBAR. FIG. 4 is a second harmonic response. Unwanted harmonic responses can be blocked with external, conventional filter techniques.

With the design as described above with reference to FIG. 3, it is necessary to fabricate different SBARs 90 with slightly different resonant frequencies. In one method, this can be accomplished after fabrication of the SBAR SCFs by isolating selected areas on the monolithic piezoelectric structures by utilizing a photoresist mask, as is well understood in the art. Once the different areas are isolated, more aluminum can be deposited at open locations in the mask to thicken the top electrode, thus lowering the frequency. Additionally, ion milling the top electrode at the open locations to remove aluminum, will raise the resonant frequency. These types of techniques provide the flexibility in design methods to provide a wide variety of filter arrangements for different applications, such as multipole filters with slightly different frequencies in each stage.

The foregoing discussion discloses and describes merely exemplary embodiments of the present invention. One skilled in the art will readily recognize from such discussion and from the accompanying drawings and claims, that various changes, modifications, and variations can be made therein without departing from the spirit and scope of the invention as defined by the following claims.

What is claimed is:

1. A multipole stacked crystal filter comprising:
 a plurality of cascaded 2-port semiconductor bulk acoustic resonator (SBAR) stacked crystal filters (SCFs) electrically connected on a common semiconductor substrate, each 2-port SBAR SCF including at least two piezoelectric layers and three electrodes, a first one of the electrodes being positioned in contact with a first surface of a first piezoelectric layer, a second one of the electrodes being positioned in contact with a second surface of the first piezoelectric layer and a first surface of a second piezoelectric layer, and a third one of the electrodes being positioned in contact with a second surface of the second piezoelectric layer opposite to the first surface of the second piezoelectric layer, wherein a respective third one of the electrodes of a particular 2-port SBAR SCF is connected to a respective first one of the electrodes of a next 2-port SBAR SCF of the cascade of SBAR SCFs; and
 at least one inductor electrically connected in shunt between a respective third one of the electrodes of a corresponding 2-port SBAR SCF and ground.

2. The multipole stacked crystal filter according to claim 1 wherein the plurality of SBAR SCFs includes two or more 2-port SBAR SCFs and wherein said at least one inductor comprises a plurality of inductors respectively electrically connected in shunt to ground between each 2-port SBAR SCF.

3. The multipole stacked crystal filter according to claim 1 wherein at least two of the 2-port SBAR SCFs have different resonant frequencies in order to provide a desired passband shape.

4. The multipole stacked crystal filter according to claim 3 wherein at least one electrode of a first one of the 2-port SBAR SCFs is of a different thickness than one electrode of a second one of the 2-port SBAR SCFs in order to establish the different resonant frequencies.

5. The multipole stacked crystal filter according to claim 1 wherein the at least one inductor provides a desired filter passband shape.

6. The multipole stacked crystal filter according to claim 1 wherein the at least one inductor and respective resonant frequencies of each of the SBAR SCFs are respectively set to provide a desired passband shape.

7. The multipole stacked crystal filter according to claim 1 wherein for each 2-port SBAR SCF the first one of the electrodes is an input electrode, the second one of the electrodes is a ground electrode, and the third one of the electrodes is an output electrode.

8. The multipole stacked crystal filter according to claim 1 wherein each of the piezoelectric layers is comprised of aluminum nitride.

9. The multipole stacked crystal filter according to claim 1 wherein each of the stacked crystal filters is positioned over a respective recess in the semiconductor substrate.

10. A method of filtering a broad band frequency signal comprising the steps of:
 providing a series of 2-port semiconductor bulk acoustic resonator (SBAR) stacked crystal filters (SCFs) electrically connected in a cascaded fashion, wherein each SBAR SCF includes at least two piezoelectric layers and three electrodes where a first electrode is in contact with a first surface of a first piezoelectric layer, a second electrode is in contact with a second surface of the first piezoelectric layer and a first surface of a second piezoelectric layer, and a third electrode is in contact with a second surface of the second piezoelectric layer opposite to the first surface of the second piezoelectric layer, wherein the respective third electrode of a particular SBAR SCF is connected to the respective first electrode of a next SBAR SCF of the series of SBAR SCFs;
 providing at least one inductor electrically connected to a third electrode of a respective SBAR SCF and ground so as to be respectively in shunt between at least two of the 2-port SBAR SCFs; and
 applying the broad band frequency signal to a first SBAR SCF in the series of 2-port SBAR SCFs and outputting a narrow band frequency from a last SBAR SCF in the series of 2-port SBAR SCFs.

11. The method according to claim 10 wherein the step of providing a series of cascaded 2-port SBAR SCFs includes providing two or more 2-port SBAR SCFs and the step of providing at least one inductor includes providing an inductor electrically connected between each of the 2-port SBAR SCFs such that each inductor is electrically connected to a third electrode of one 2-port SBAR SCF and ground.

12. The method according to claim 10 wherein the step of providing a series of cascaded 2-port SBAR SCFs includes providing at least two of the 2-port SBAR SCFs having different frequencies in order provide a desirable shape of the narrow band output frequency.

13. The method according to claim 10 wherein the step of providing an inductor includes selecting the inductor with on inductive value to provide a desired filter passband shape.

14. The method according to claim 10 wherein the steps of providing a series of 2-port SBAR SCFs and providing said at least one inductor include selecting the SBAR SCFs and inductor frequencies to provide a desired passband shape.

15. The method according to claim 10 further comprising the step of providing an electrode of one of the 2-port SBAR SCFs with a different thickness than an electrode of another one of the 2-port SBAR SCFs in order to establish a different resonant frequency.

16. The method according to claim 10 wherein the step of providing the three electrodes includes providing a first input electrode, a second ground electrode, and a third output electrode for each SBAR SCF.

17. A multipole stacked crystal filter comprising:

a plurality of cascaded 2-port semiconductor bulk acoustic resonator (SBAR) stacked crystal filters (SCFs) electrically connected on a common semiconductor substrate, each 2-port SBAR SCF including two piezoelectric layers and three electrodes, an input electrode being positioned in contact with a first surface of a first piezoelectric layer, a ground electrode being positioned in contact with a second surface of the first piezoelectric layer and a first surface of a second piezoelectric layer, and an output electrode being positioned in contact with a second surface of the second piezoelectric layer opposite to the first surface of the second piezoelectric layer, wherein the respective output electrode of one SBAR SCF is connected to the input electrode of a next SBAR; and at least one inductor connected in shunt between the output electrode of an SBAR SCF and ground for each 2-port SBAR SCF, wherein the 2-port SBAR SCFs and the inductors provide a desired filter passband shape.

18. The multipole stacked crystal filter according to claim 17 wherein one electrode of a first one of the 2-port SBAR SCFs has a different thickness than an electrode of a second one of the 2-port SBAR SCFs in order to establish a different resonant frequency between the first and second 2-port SBAR SCF.

* * * * *